United States Patent
Abbot et al.

(10) Patent No.: US 8,170,524 B2
(45) Date of Patent: May 1, 2012

(54) POWER LINE COMMUNICATION SYSTEM AND AN INTELLIGENT METER

(75) Inventors: Stephen Allen Abbot, Waikanae (NZ); John Richard Futter, Horokiwi (NZ); James Lee Allworthy Martin, Mt Eden (NZ); Gerard Brendan Rowe, North Shore (NZ); Rand Cary Huso, Duvall, WA (US)

(73) Assignee: Pulse Utilities International Limited, Auckland (NZ)

( * ) Notice: Subject to any disclaimer, the term of this patent is extended or adjusted under 35 U.S.C. 154(b) by 469 days.

(21) Appl. No.: 12/417,464

(22) Filed: Apr. 2, 2009

(65) Prior Publication Data
US 2009/0256686 A1     Oct. 15, 2009

Related U.S. Application Data

(63) Continuation of application No. 10/583,527, filed as application No. PCT/NZ2004/000324 on Dec. 16, 2004, now abandoned.

(30) Foreign Application Priority Data

Dec. 16, 2003 (NZ) ........................................ 530254

(51) Int. Cl.
*H04M 9/00* (2006.01)
(52) U.S. Cl. ................ 455/402; 340/825.02; 340/870.02
(58) Field of Classification Search .... 340/12.32–12.39, 340/310.11, 825.02, 870.02; 455/400, 402
See application file for complete search history.

(56) References Cited

U.S. PATENT DOCUMENTS

| 5,032,833 | A | * | 7/1991 | Laporte | ...................... 370/351 |
| 5,912,633 | A | * | 6/1999 | Allison et al. | ........... 340/870.02 |

* cited by examiner

*Primary Examiner* — Kent Chang
*Assistant Examiner* — Dinh P Nguyen
(74) *Attorney, Agent, or Firm* — Kenyon & Kenyon LLP

(57) ABSTRACT

A power line communication system including a plurality of intelligent devices in communication with a power line and operable to monitor energy usage at a site and communicate usage data onto the power line, and a controller also in communication with the power line, wherein each intelligent device maintains a routing table identifying a first set of other intelligent devices downstream of it relative to the controller that it can communicate with directly and identifying a second set of other intelligent devices downstream of it relative to the controller that it can communicate with through one or more of the first set of other intelligent devices.

17 Claims, 3 Drawing Sheets

POWER LINE COMMUNICATION SYSTEM AND AN INTELLIGENT METER

RELATED APPLICATION INFORMATION

This application is a Continuation of U.S. patent application Ser. No. 10/583,527, filed Jun. 16, 2006 now abandoned, which is a National Phase Application of PCT/NZ2004/000324 filed on Dec. 16, 2004, which claims priority to New Zealand Patent Application No. 530254 filed on Dec. 16, 2003, each of which is expressly incorporated herein in its entirety by reference thereto.

TECHNICAL FIELD

This invention relates to communication methodologies and systems utilising power lines, such methodologies and systems often also referred to as mains communication methods and systems. In particular, but not exclusively, the present invention relates to the establishment of a power line communication network and a method of communicating over the network.

BACKGROUND

Communication over power lines has been proposed and used for remote metering. In typical systems for remote metering, a central controller communicates with a meter using a superimposed signal on the mains network. A meter sends an acknowledgement signal back to the central controller and may perform some function dependent on the message received.

Two well known problems that need to be overcome by power line communication systems are the noisy environment and potentially large signal attenuation. Various reading techniques and communication protocols have been developed to address these problems, for example using meters as digital relays to enable communication from the central controller to each of the meters. Examples of power line communication systems using signal repeaters are described in European patent publication No. 0 201 253 B1 and international patent publication no. WO 95/01030.

Advances in meter technology have provided improved functionality. For example, meters may communicate by a wireless link with other meters and with network controllers to perform various functions. An example of such a system is described in international patent publication no. WO 97/29466. A problem with such meters is the additional costing complexity resulting from the wireless communication. Also, as radio spectrum becomes increasingly in demand, the use of wireless communication from potentially millions of sources may not be commercially viable in many cases.

A mains network provides an extensive existing infrastructure. Further exploitation of the existing mains infrastructure would be advantageous. For example, increased functionality, both in terms of control and monitoring of the power network may be achieved, including improved metering and providing additional services to customers.

As a consequence of deregulation in the power supply industry in many countries, achieving reconciliation of power supplied and determining the power used and network losses has become a significant problem. The problem arises principally on the low voltage distribution network, where more than one retailer exists as well as a separate lines company. There is a need for improved measurement of network losses so that accuracy in power reconciliation can be improved.

It is thus an object of the present invention to provide a power line communication system and method that provides additional functionality for one or both of power network management and the provision of network services, or at least to provide the public with a useful alternative.

DEFINITIONS

Computer controller—computerised apparatus for managing communications within a mains communication network. The computer controller typically includes one or more suitable computer processors, a suitable operating system and suitable application(s). For example and without limitation the computer controller may be a computer or network of computers operating Windows NT® or Linux.

Intelligent device—a device that includes a computer processor and associated memory and a communication interface allowing the device to perform at least some communication functions. Intelligent devices include, without limitation, a relay or meter including a computer processor, memory and communication interface.

Power usage profiling—identification of patterns of use of power at a specific site or by a specific device that is connected to the mains communication network.

Utility—a retail supplier of power to customers.

SUMMARY OF THE INVENTION

According to a first aspect of the present invention, there is provided an intelligent device for a power line communication system that has stored in memory information uniquely specifying the intelligent device's identity, includes an interface for data communication with a power line and is operable to perform a configuration process including the steps of using said interface to:

a) detect data of a first data type through the interface and in response thereto extract from the data of a first data type and record in memory identity information for the source of the data of a first data type and generate on said interface data of a second data type that have as a destination address the source of the data of a first data type and includes the information specifying the intelligent device's identity;

b) detect data of a second data type that have the intelligent device as a destination address and in response thereto extract from the data of a second data type and record in memory the identity of the source of the data of a second data type and generate on said interface data of a third data type that includes information identifying the source of the data of a second data type and the information specifying the intelligent device's identity;

c) detect data of a third data type and in response extract there from and record in memory information identifying the source of the data of a third data type associated with the information identifying the source of the data of a second data type included in the data of a third data type and generate data on said interface containing the information identifying the source of the data of a third data type, the information identifying the source of the data of a second data type included in the data of a third data type and the information specifying the intelligent device's identity.

Preferably, the data generated in step c) is addressed to at least one source of data detected in step a).

Preferably, the steps of extracting and recording in step c) are only performed for data of a third data type that are addressed to the intelligent device.

Preferably, the address of the intelligent device is the same as the information specifying the intelligent device's identity.

Preferably, the intelligent device is further operable to determine an indicator of the quality of communication between itself and the source of detected data and rank identity information recorded in memory dependent on said indicator.

Preferably, the intelligent device is operable to in response to detection of data of a second data type generate data of a fourth data type including as a destination address the source of the data of a second data type and the configuration process may further include the steps of using said interface to detect data of a fourth data type that have the device as a destination address and in response thereto generate on said interface data of a first data type.

Preferably, the intelligent device is operable to ignore detected data of a second data type that were generated by a source that was recorded in memory as a source of data of a first data type in in step a).

Preferably, the intelligent device is operable to use said interface to generate data of a first data type and wherein the data of a first data type include a counter, wherein step a) further includes identifying the value of the counter of any data of a first data type detected, associate the value of the counter with the recorded identity information for the source of the data of a first data type, increment the value of the counter and allocate the incremented value to a counter in any data of the first data type generated by the intelligent device as a result of data received from the source of the data of a first data type.

Preferably, the intelligent device is operable to ignore detected data of a first data type that has a counter value more than a threshold value. Preferably, the threshold value is a value related to the value of the counter from the last item(s) of data of the first data type received. More preferably, the threshold value is one more than the value of the counter from the last data of a first data type received.

Preferably, the data of a third data type include a counter and the data generated in step c) is in the form of data of a third data type and the intelligent device associates the value of the counter with the information recorded in step c) that identifies the source of the data of a third data type and the intelligent device increments the counter when generating data of a third data type in response to detection of data of a third data type in step c).

Preferably, the intelligent device is operable to also generate data onto said interface otherwise than in accordance with the configuration process.

Preferably, the intelligent device is operable to generate text messages onto said interface.

Preferably, the intelligent device is operable to receive control messages through said interface and communicate control messages to a power distribution board to facilitate load shed dependent on said control messages.

According to a second aspect of the present invention, there is provided a power line communication system including a plurality of power lines in communication with a controller through a power line modem, each power line having a plurality of intelligent devices as described in the preceding paragraphs in communication with it, wherein the controller is operable as one of said plurality of intelligent devices and is also in communication with a computer controller that is operable to receive data from the intelligent devices via the controller and to send data to the intelligent devices via the controller.

Preferably, data other than configuration data, which is generated onto a power line by an intelligent device or the controller, includes a destination address and an intermediate address, wherein each intelligent device monitors communications on the power line and if the destination address of communications matches information identifying the source of the data of a second data type included in the data of a third data type that was recorded by an intelligent device in accordance with step c), then that intelligent device regenerates the data, but with the intermediate address field comprising the information identifying the source of the data of a third data type recorded in step c) that is associated with the information identifying the source of the data of a second data type included in the data of a third data type that matches the destination address.

According to a third aspect of the present invention, there is provided a power line communication system including a plurality of intelligent devices in communication with a power line operable to monitor energy usage at a site and communicate usage data onto the power line and a controller also in communication with the power line, wherein each intelligent device maintains a routing table identifying a first set of other intelligent devices downstream of it relative to the controller that it can communicate with directly and identifying a second set of other intelligent devices downstream of it relative to the controller that it can communicate with through one or more of the first set of other intelligent devices.

Preferably, the routing table further identifies a third set of other intelligent devices upstream of it relative to the controller that it can communicate with directly.

Preferably, the routing tables are formed by an interrogation process initiated by the controller that requests the intelligent devices that can receive data directly from the controller over the power line to respond with information identifying what other intelligent devices the intelligent devices that can receive data directly from the controller over the power line can communicate with either directly or through further intelligent devices, wherein the intelligent devices that can be communicated with through said further intelligent devices are identified through an interrogation process conducted by said further intelligent devices.

Further aspects of the present invention may become apparent from the following description, given by way of example of preferred embodiments only and with reference to the accompanying drawings.

DETAILED DESCRIPTION OF THE DRAWINGS

Figure 1:
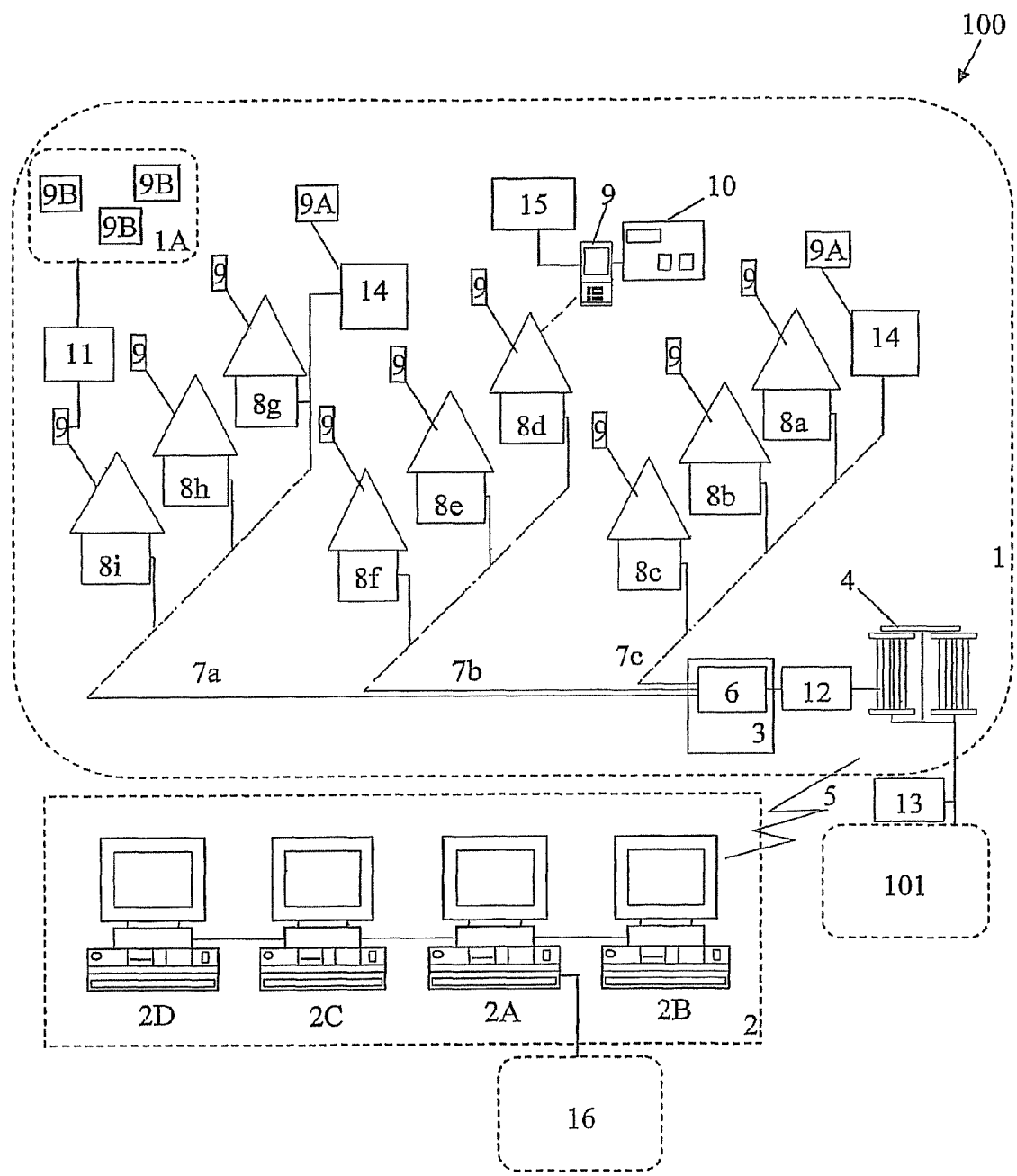
FIG. 1: shows a diagrammatic representation of a power line communication system in accordance with an aspect of the present invention.

FIG. 1 shows a schematic representation of a mains communication and control network 100 in accordance with the present invention. The mains communication and control network 100 includes a mains communication network 1. This forms the lower levels of a hierarchal communications network topology that supplies power to customer sites 8a-i that are connected to the mains communication network 1 and also forms a low voltage sub-network of a larger mains network 101, which typically includes a high voltage network that supplies high voltage three phase power to the mains communication network 1.

A computer controller 2 provides the upper levels of the communications network topology. The computer controller 2 includes, in this example of a preferred embodiment, a central control unit 2A, which communicates with the mains communications network 1 through a communications controller 2B. A database 2C is provided for the central control unit 2A, containing the necessary control information for the mains communication network 1 and also containing power use information from the mains communication network 1. Customer billing may be managed by a billing system 2D.

The mains communication network 1 shown in FIG. 1 may be one low voltage sub-network of many in the wider mains network 101. The communications controller 2B may communicate with a large number of such sub-networks.

The mains communication network 1 includes a controller 3, which is suitably located at a transformer 4. The transformer 4 may receive high voltage power from the mains network 101 and output low voltage power to the rest of the mains communication network 1. The computer controller 2, particularly the communications controller 2B may communicate with the controller 3, through for example a wireless communication channel 5. Other communication channels may be used.

The controller 3 includes three power line modems 6, one modem per phase 7a-c of the mains communication network 1 on the low voltage or demand side of the transformer 4. The power line modems 6 may, for example use a power-line carrier employing FSK modulation with a carrier frequency in the range of 67 kHz to 87 kHz. Each phase 7a-c feeds into a number of the customer sites 8a-i. Each of the customer sites 8a-i includes a meter 9, with each meter 9 being an intelligent meter. Some further customer sites connected to the phases 7a-c may not have intelligent meters, but these are unimportant to the operation of the present invention and therefore are not shown in the accompanying drawings or described herein.

The mains communication network 1 may include one or more micro-generation or energy storage facilities 14. In FIG. 1, two micro-generation/energy storage facilities 14 are shown. The micro-generation/energy storage facilities 14 may represent for example, small hydro-generators, solar-generators, wind-generators or fuel cells and may be located at any one or more of the customer sites 8a-i or be separate from the customer sites 8a-i. The micro-generation/energy storage facilities 14 each include a meter 9A.

The communication functions of the mains communication and control network 100 are now described with reference to the example function of meter data collection. The controller 3, through the appropriate power line modem 6, polls a meter 9 for the power consumed at a site 8a-i since the last time the associated meter 9 at the site was polled. The meter 9, which includes its own transmitter, then sends information indicating the power consumed to the controller 3, where it is buffered until requested by the computer controller 2. The central control unit 2A then initiates a communication session with the controller 3 through the communications controller 2B, which receives the buffered information through the communication channel 5. The central control unit 2A then updates the database 2C with the newly received information. The billing system 2D may then generate a bill at a required time, based on the information stored in the database 2C. In addition, the updated billing information may be sent by the central control unit 2A to the meter 9 for display on the customer display unit 10.

Figure 2:
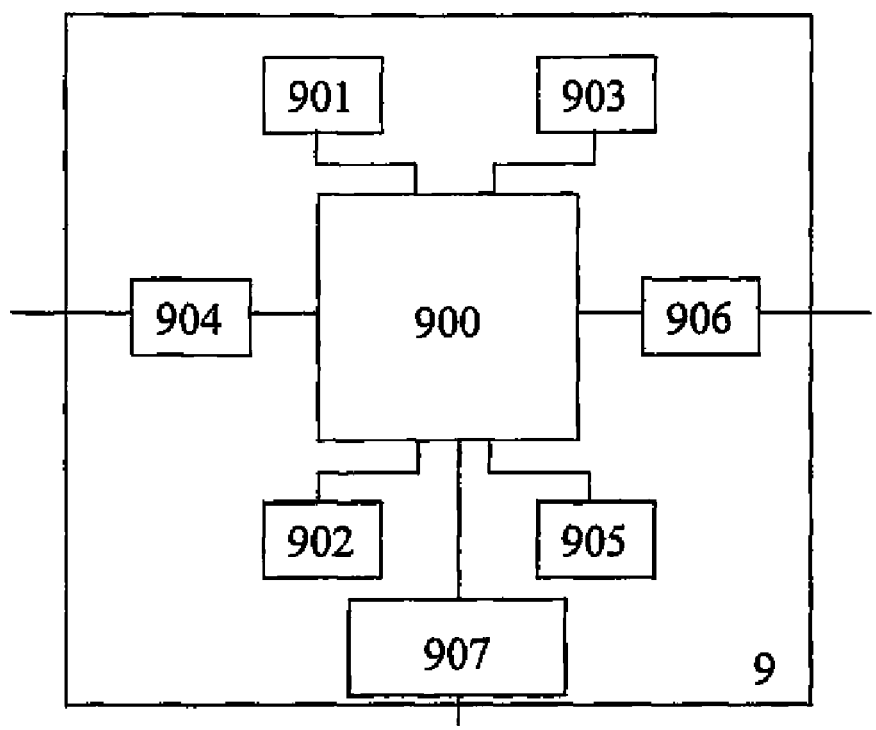
FIG. 2: shows a block diagram of a meter in accordance with the present invention.

Each meter 9 used in the mains communication network 1 is an intelligent power meter. Typically, the meter 9 will replace any existing electromechanical meter at each customer site 8a-i. A block diagram representation of a meter 9 is shown in FIG. 2. The meter 9 includes a computer processor 900, which may for example be a Dallas 5002FP, 8051 compatible processor. External memory 901, which may be SRAM, is provided in communication with the processor 900 and the operations of the processor 900 are timed by a clock 902. The meter 9 also includes EEPROM 903. The meter 9 may communicate with optional external devices, through a serial communications interface 904. The meter 9 may also include its own display 905 for communication of information to users. A power line modem 906 allows the meter 9 to communicate with the controller 3 through a phase of the mains communication network 1.

The meter 9 records the power usage using an energy measurement module 907. For example, the energy measurement module may be a SAMES SA9102C energy-metering integrated circuit, available from South African Micro-Electronic Systems, Pretoria, South Africa. The resulting data is stored in memory 901 using an encryption algorithm. Bidirectional energy measurement modules are also available from South African Micro-Electronic Systems for use in a bidirectional meter.

The EEPROM 903 contains the starting meter count, the number of pulses for each kilowatt hour, the number and type of connections to the meter, type of devices attached to the serial communications interface 904, and the functions of any additional outputs. Identification information for the meter 9 that identifies the meter from other meters, referred to herein as an electronic serial number, is also stored in a protected part of the EEPROM 903.

The computer processor 900 has precedence over communications while the meter reading is accumulated in hardware. A hardware register (not shown) provided for the meter reading is read by the computer processor 900, then reset when the communications channel is not in use.

When the central control unit 2A sends a poll to a meter 9, the poll includes a specification of the current time. Upon receipt of a time packet from the central control unit 2A, the communications controller 2B sets its clock if it differs from that in the time packet. The time packet will be queued together with all the other packets for sending to the controller 3 when the connection is established. During the time the packet is queued for transmission, the current system time will continue advancing. Therefore, when the connection is established, and the time is forwarded to the controller 3, the time fields of the packet will be updated to the current system time.

Data is requested from each meter 9 by the controller 3 periodically, for example once every several hours. Contained in the request for data packet (initiated by the controller) is the correct time. The meter 9 will therefore be refreshed with the correct time periodically. The variable transmission delay to the meters 9 should also be accounted for. Since each message is acknowledged, the round trip time divided by two can be calculated, and may be referred to as the latency. The controller 3 sends each individual meter 9 a time signal corrected by the latency applicable to that meter 9. The latency used for a current transmission may be based on historical information or a further communication from the controller 3 may cause the meter 9 to advance its time.

One of the optional external devices that may be connected to the meter 9 through the serial interface 904 is a customer display unit 10. The customer display unit 10 may have increased display capabilities and display information to the customer, such as the amount due since last payment, recent consumption information and the total meter reading. In addition, messages sent from the central control unit 2A or from elsewhere to the meter 9 may be displayed on the customer display unit 10.

Figure 3:
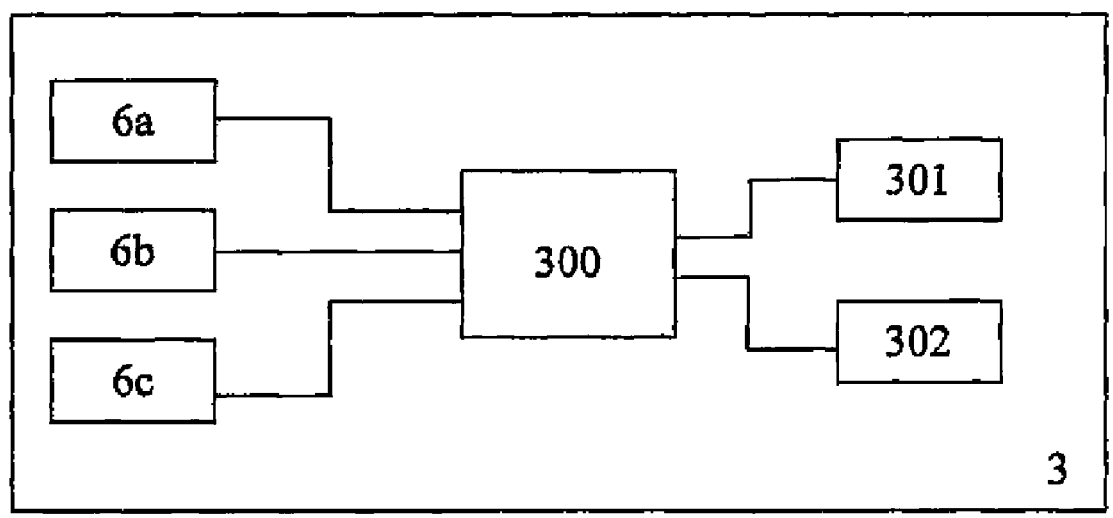
FIG. 3: shows a block diagram of a controller in accordance with the present invention.

FIG. 3 shows a block diagram of a controller 3. The controller 3 includes a processor 300 for controlling the three power line modems 6a-c through serial communication buses and manages the receipt, transmission and storage of information from the various meters 9 and from the communications controller 2B. A memory 301 is provided to store a routing table (see herein below) and a communications interface 302, suitably a wireless communications interface, is provided to allow communication with the communications controller 2B.

The communications controller 2B is a real time processing system that links the central control unit 2A and database 2C with each controller 3 and subsequently each meter 9. The communications controller 2B may communicate with the central control unit 2A via a serial communications link or Ethernet using TCP/IP. Where the meters 9 in the mains communication network 1 can generate alarms, the communications controller 2B preferably receives the alarm signals and forwards these on to the central controller 2A. The communications controller 2B includes an interface to communicate with the controller 3, which in FIG. 1 is a wireless interface, although a leased line modem, standard dial up modem, or fibre-optic modem may be used instead. As stated herein above, the communications controller 2B preferably communicates with a plurality of controllers 3.

The central control unit 2A stores an operating system such as Windows NT®. It also includes appropriate software to manage the database 2C. The central control unit 2A performs essentially two main functions, the first being to manage the database 2C and the second to control the functions of the mains communication network 1.

Figure 4:
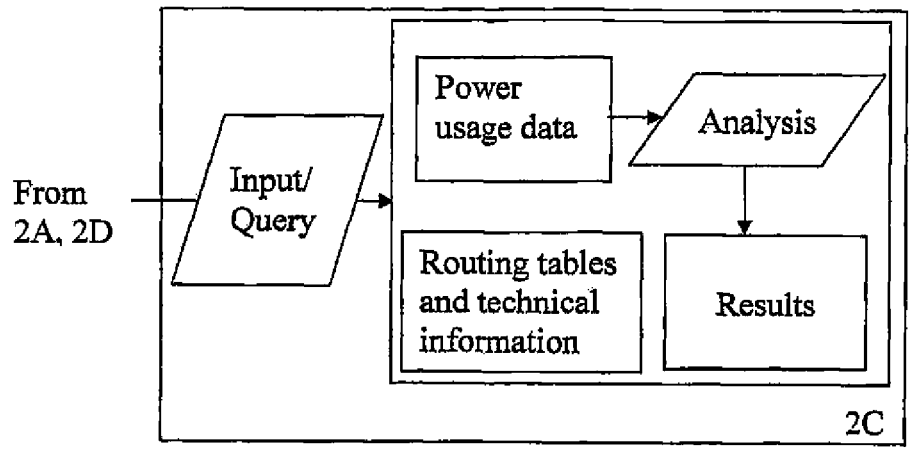
FIG. 4: shows a representation of the information and functions performed by the database in the communication system of FIG. 1.

FIG. 4 shows a representation of the functions of the database 2C. Power usage data from each meter 9, which has been received through the controller 3 and communications controller 2B, is stored in memory. The database 2C may include an analysis function to analyse the raw power usage data and provide specific output results. A query functionality may be provided to allow the billing system 2D to retrieve either or both of the raw power usage data or results of the analysis function. In addition, the database 2C may store the routing tables that dictate the path that data communications take through the mains communication network 1. The formation and use of the routing tables are described in more detail herein below. The central control unit uses the routing tables when sending out information to the meters 9. Database 2C may also include the location and technical specification of each controller 3 and each meter 9. The controllers 3 and meters 9 may be identified in the database 2C by their electronic serial number, which is used by the central control unit 2A to distinguish between the various controllers 3 and meters 9 and also to allow each controller 3 and each meter 9 to identify the information communicated within the mains communication network 1 that is destined for it. The location information may be used for the purposes of billing, repair of faults and for intelligent relaying.

The computer controller 2 may perform statistical analysis of the usage data, which may be periodically updated, to provide power usage profiling. The power usage profiling may assist a power utility in the estimation of demand, for instance, by profiling supply from particular distribution transformers 4 to their respective-mains communication network 1. The power usage profile for the customers of a utility supplied from a particular grid exit point provides a current inventory of energy usage. The utility may therefore determine in an almost real-time manner what its bill for supply from that grid point should be.

Power usage profiling may also benefit a utility in terms of asset management. Specifically, the power usage profile obtained from the controller 3 provides information on the load profile for its associated transformer 4 and phases 7a-c. Changes in usage pattern can be used to detect certain events, such as loss of supply to an area caused by a distribution fault, accidental disconnection of individual premises and/or to indicate tampering/fraud. It also provides the utility with accurate, monitored, quality of supply (i.e. outages) information. Such information is of use for scheduling asset maintenance, upgrades and replacement. Preventative maintenance may be assisted by monitoring the quality of network assets. This may be achieved by measuring changes in power line communication quality through the network. Information about communication quality is retrieved periodically. Specifically, bit error rate tests may be performed routinely during auto-configuration of the network and packet error rate tests can also be performed on request. By identifying trends of increasing error rates over time, ageing network assets can be identified.

The above described functionality, together with many other functions that may be provided, for example by other external devices connected to the meter 9, require bi-directional communication between the mains communication network 1 and computer controller 2 and within the mains communication network 1. An important aspect of the present invention is the method of communication between these two networks and within do the mains communication network 1. To establish the communication channels, a number of routing tables are formed and stored in the computer controller 2 and mains communication network 1. The routing tables identify the various paths that communications may take between the computer controller 2 and mains communication network 1, in particular between the central control unit 2A and each meter 9.

Formation of Routing Tables

The central control unit 2A and the controllers 3 are the primary controllers in respect of the formation of routing tables. The central controller 2A uses a priori knowledge of the network topology to separate the various meters 9 into several sets, each set defined by all the meters 9 and their attached optional devices connected to a single phase of a particular transformer 4. The controller 3 is responsible for forming the routing table for the phases in which it is in communication with. This subdivision may reduce the time to create the routing tables and facilitate the recreation of sections of the logical network defined by the routing tables to overcome local communication problems. Recreation of the logical network may be achieved by a controller sending out WCHM packets (see herein below) and waiting for responses in the same way that the logical network is first created.

Figure 5A:
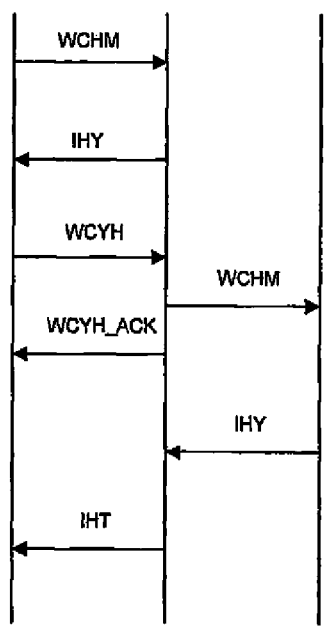
FIGS. 5a, b: show diagrammatically an example of configuration packet communications in the communication system of FIG. 1.

Referring now to FIG. 5, a diagrammatic representation of the packet flows for establishing the routing tables is shown. Upon initialisation, or upon prompting by the central control unit 2A, the controller 3 generates and transmits to each of its serial communication buses a packet of a first type, referred to herein as the WHO_CAN_HEAR_ME (WCHM) packet. The power line modems 6, which are intelligent modems, each receive the WCHM packet and in response thereto send back to the controller 3 a packet of a second type referred to herein as an I_HEAR_YOU (IHY) packet. The IHY packet indicates to the controller 3 that a modem is present on that serial communication bus and includes a field containing the electronic serial number of the modem. The controller 3 records how many power line modems 6 it is in communication with, their electronic serial number, and on which serial bus they are located. The controller 3 may then collate the IHY packets and send a packet to the central control unit 2A of a third type referred to herein as an I_HEARD_THESE (IHT) packet that specifies the electronic serial number of each modem.

The controller 3 may then send a packet of a fourth type, referred to herein as the WHO_CAN_YOU_HEAR (WCYH) packet. The WCYH packet prompts each power line modem 6 to generate a WCHM packet on its output, which represents one of the phases 7*a-c* of the mains communication network 1. The WCHM packet includes the electronic serial number of the power line modem 6 that sent the packet. The power line modem 6 may optionally have the same electronic serial number as the controller 3 to which it is connected. Optionally, the power line modems 6 (and meters 9) may automatically generate, after a predetermined delay, a WCHM packet after receipt of a WCYH packet.

Each meter 9 at each customer site 8*a*-8*i* monitors the phase to which they are connected and upon receipt of a WCHM packet by a meter 9, the meter 9 enters the electronic serial number in the WCHM packet into its routing table as a primary parent i.e. a device from which it can receive communications directly. The meter 9 responds to the WCHM packet with an IHY packet addressed to the source of the WCHM, which in this case is a power line modem 6. The IHY packet includes a field containing the electronic serial number of the meter 9 that received the WCHM packet. The power line modems 6 receive the IHY packets from the various meters 9, collate these and send notification to the controller 3 identifying each meter 9 that responded to their respective WCHM packet in an I_HEARD_THESE (IHT) packet, which includes the electronic serial numbers contained in all the IHY packets received. The controller 3 then enters in its routing table the electronic serial numbers from the IHT packet as a primary child i.e. devices to which it can send information directly using it associated power line modems 6.

Figure 5B:
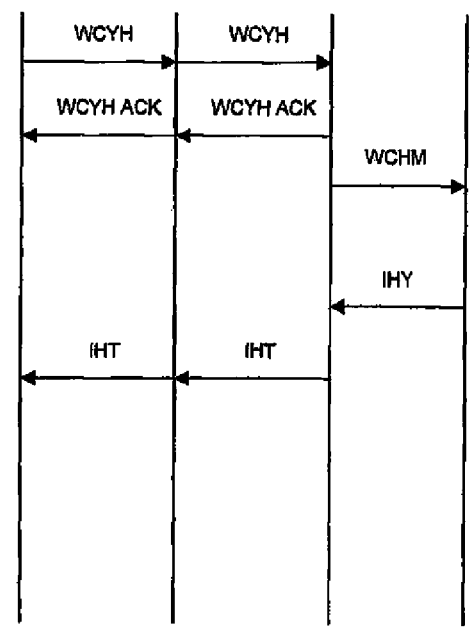

Referring now to FIG. 5*b*, the controller 3 then sends out a WCYH packet to each primary child meter through the appropriate power line modem 6. Each primary child meter 9 acknowledges receipt of the WCYH packet and also generates a WCHM packet on its output, which is a phase from the transformer 4. In an alternative embodiment, each meter 9 may automatically generate a WCHM packet after receiving such a packet. Each meter 9 that receives this WCHM packet returns an IHY packet. Each primary child meter 9 records in its routing table as primary children the electronic serial number of all meters that returned an IHY packet to it and each meter 9 that received a WCHM packet adds the primary child meter as a direct parent in their individual routing table. Each primary child meter 9 also sends through its power line modem 906 an IHT packet to the controller 3 through the power line modem 6 indicating the electronic serial number contained in IHY packets that it received. The controller 3 then adds the electronic serial number as secondary children in its routing table (i.e. meters that can be communicated with via another meter logger). The controller 3 also associates each secondary child with each of the primary children that sent an IHT packet containing the electronic serial number of that secondary child. This enables the controller 3 to identify to which primary child information should be sent in order to reach a particular secondary child.

Each meter 9 identifies two or more paths back to the controller 3. To achieve this, each meter 9 records the electronic serial number of any meter from which it received a WCHM packet. The source of the first WCHM packet received could be identified as Parent 1. The source of the second WCHM packet received could be identified as Parent 2. Similarly, the sources of any subsequent WCHM packets could be recorded as Guardians. The Parent and Guardian meters thus identified represent alternative paths back to the controller 3.

The above configuration process continues, with the controller 3 sending WCYH packets to each secondary child through the appropriate primary child in order for it to identify its tertiary children. The controller 3 then sends WCYH packets to the tertiary children through the primary and secondary child meter loggers and so on until all meters 9 have been entered into the routing table of the controller 3. Each meter 9 maintains its own routing table, extracting the electronic serial numbers from IHT packets received from its direct children and associating the serial numbers with its direct children. Thus, each meter knows all the other meters with which it can communicate directly (its parents and primary children) and also knows all the meters it can communicate with indirectly through each of its primary children.

The IHT packets may be addressed to the parents of a meter or simply transmitted onto the power line. If the IHT packets are addressed, recipient parent meters may simply record the identity information of the secondary children associated with the identity information of the sender of the IHT. The recipient meters then forward the IHT packets to their parents, who will forward the packet to their parents, associating the identity information contained in the packet with their relevant primary child and so on until the controller 3 receives the packet. If the IHT packets are not addressed, then each recipient meter compares the source of the IHT packet to all of its children and adds the identity information in the IHT packet only if there is a match. The recipient meter associates the identity information in the IHT packet with the child that matched the source of the IHT packet and then addresses the IHT packet to its parents.

To avoid continuous loops in the configuration process, each meter 9 ignores IHY packets that it receives containing the electronic serial number of any meter that is listed as a parent. Also, should the identity information in any IHT packet match a parent of the recipient meter or itself, the IHT packet is ignored.

In one embodiment, when the controller 3 transmits a WCHM packet, it immediately follows this with a bit error rate test. Each meter 9 will receive the WCHM packet and bit error rate test and respond with an IHY packet and a quality indicator based on the bit error rate test. Each meter 9 also sends a bit error rate test when it sends a WCHM. Thus, the controller 3 and each meter 9 can record for each meter that it is in communication with, the quality of the communication path to that meter. This process allows each meter to rank the various communication paths to both its parents and its children, using the highest quality communication path first. If the communication path of highest quality should fail, for example by failure to receive an acknowledgement of receipt packet, the controller 3 or meter 9 uses the next highest quality communication path, if one exists.

The network configuration packets WCHM, IHY, WCYH and IHT are used to create a logical power-line network structure. At least selected of these configuration packets contain the electronic serial number of the controller 3 and this electronic serial number is relayed by each meter 9. For example, each WCHM packet contains the electronic serial number of the controller 3. Where a meter sends the WCHM packet, it determines the electronic serial number from the WCYH packet that it received. Every meter 9 stores the electronic serial number of its controller 3 in EEPROM 903.

This logical network, the structure of which is determined by the parent and child links in the routing tables, will be updated periodically to ensure that the logical network remains current.

The system may also recreate the logical network on the occurrence of one or more particular events. Any device within the mains communication network 1 may transmit onto its associated phase a packet referred to herein as a NETWORK_CHANGED (NC) packet. Typically, it will be the meters 9 at any of the customer sites 8*a-i* that will transmit a NC packet. During the lifetime of a logical network between periodic updates, the network may change, for example due to routine maintenance (e.g. a street may be switched to another phase of a transformer) or by adding or removing meters 9. If this happens the new meter, or one that was previously connected to a different controller, will detect the traffic on the network and notice a different controller electronic serial number in the packets communicated over the phase to which it is connected. When this happens, that meter will send a NC packet onto the phase and meters 9 that detect the NC packet, relay the packet to the controller 3, which initiates a recreation of that part of the network.

The variable noise and attenuation on the mains network has significant consequences for meter communications. Specifically, meters that could be contacted at the time the logical network was last configured (either at a pre-programmed time or as a result of a NETWORK_CHANGED packet) may not necessarily be contactable at some later instant. Maintaining communications between the central control unit 2A and each meter 9 may be particularly important for real time control of the mains communication network 1, for example to provide for load shed.

The central control unit 2A maintains a list of all contactable meters 9. To achieve this, the controller 3 sends out PING packets to individual meters 9 in its routing table, at times when there is no other network traffic, and monitors the responses to build a list of the currently contactable meters 9. Meters 9 that were in the logical network when it was created but can't now be contacted are therefore identified. Should they remain out of contact using the current routing table for a certain predetermined period, a local network recreation is initiated by the controller 3. In addition, if a meter 9 is unable to contact another meter 9 (determined by failure to receive an acknowledgement or other return information) after a predetermined number of tries, for example three attempts using all available paths, an error is generated by the transmitting meter and sent to the controller 3. Should the meter remain out of contact for too long a period, a local network recreation is initiated by the controller.

A manual over-ride may be provided to allow for the recreation of the logical network on demand and to specify fixed communication channels within the logical network. For example, the central control unit 2A may send packets referred to herein as YOU_HEARD_THESE (YHT) and YOUR_PARENT_IS (YPI). These packets respectively identify the meter's children and its parent or parents and guardians.

The quality of communications between meters can be determined by use of a packet error rate test. The central control unit 2A can request a controller to initiate a packet error rate test between any desired meters. A known signal is transmitted, including a signature identifying it as a packet error rate test. The recipient meter 9 records the error rate and forwards this to the controller 3. The controller 3 in turn forwards the result to the central control unit 2A. Should the packet error rate test results be unacceptably low, the options available to the central control unit 2A include initiating a local network recreation or manually reconfiguring the meters routing tables using the YHT and the YPI packets. Communication quality indicators other than a packet error rate test may be used if required.

When the logical network is recreated, the previous logical network is saved as a backup network. This allows reconstruction of a previous working logical network should the new network be inoperable for some reason.

In the foregoing example of formation of routing tables, only a two level table in the child direction is formed in each meter—its direct children and all the meters that the direct children can communicate with. The meter does not know whether any child is a secondary, tertiary or higher level child. Similarly, the controller 3 and central control unit 2A do not know where each meter is in the hierarchy apart from the primary children of the controller 3. Also, only the direct parents are recorded. This embodiment is preferable as reducing the memory requirements for the routing tables and reducing network communications for establishing the logical network.

In an alternative embodiment, a counter may be added to the IHT packets, which is incremented each time the IHT packet is relayed to a parent. Therefore, each meter knows how far away each meter is in terms of transfers through other meters. The IHT meters may also include a quality indicator that provides an accumulated indication of the quality of communication between meters, taking into account the retransmissions that take effect. This information can be associated with each child and used by the meters and the controller that receives the IHT packet to choose a path to a particular meter. Each meter may then, either know how many steps away each meter is or alternatively know the meters that are one, two, three, four and five steps away, with those that are more than five steps away being grouped together.

Also, a counter may also be associated with each WCHM packet, which is incremented each time a meter sends out a new WCHM packet. A meter may ignore a WCHM packet if the counter in it is too much higher than the counter in the last WCHM packet they received. For example, to achieve an efficient routing table, if the counter in a WCHM packet is two or more values higher than the counter in the last WCHM packet, it may be ignored.

The WCYH packets may further accumulate in order the electronic serial numbers of all the meters through which it 'traveled' so that each meter can record fully the path back to the controller 3, or at least more than one step back to the controller 3.

Data Communication

During operation, each meter 9 listens to all communications on the phase 7*a-c* to which it is connected. Each packet transmitted onto the network by a device contains the electronic serial number of the source of the packet, the electronic serial number of the device that is the final destination for the packet, and an intermediate meter electronic serial number if a relay is required. The packet is received by a meter 9 designated as the intermediate one (if one is designated), and that meter will change the intermediate meter electronic serial number to the next meter in the path to the device having the destination electronic serial number (using information stored in its routing table) and transmits the modified packet.

The meter identifies the appropriate route over which to transfer a packet by a software routine that examines its routing table upon receipt of a message destined for another meter or for the controller. The destination of any message is dictated by an electronic serial number field. If the message destination is the controller 3, then the meter 9 forwards the message to its parent. The parent repeats the process and forwards the message to its parent and so on until the message is delivered to the controller. If the message destination is another meter, the meter that received the message examines its routing table to see if the destination meter is a child. If so, the routing table is further examined using a software routine that identifies the appropriate intermediate destination of the packet. This routine works backwards from the destination electronic serial number to identify its parent, and then the parent of that parent and so on until it is one level below the meter that has received the message. This may only ever be a two stage process if the meter does not know how far away other meters in its routing table are. The packet is then despatched to this intermediate destination meter and the process repeated.

Each packet is sent by a particular device in the network to an intermediate meter up to three times before flagging an error and giving up on that communications path. If the communications fail on an upstream path (i.e. the message is being relayed to the controller) then the meter will try to relay the message through its second parent. Should this route also fail, then the message will be relayed through one of the guardian meters. If this also fails and the communications don't get through to a meter one level upstream (i.e. closer to the controller) the meter is designed to attempt to jump over the meter just upstream and attempt to communicate with one further upstream. This is done by examining the routing table and identifying the parent's parent (if this information is available) and relaying the message through this meter. Should communications fail on the downstream path (i.e. the message is being relayed from the controller) the meter is designed to attempt to jump over the meter just downstream and attempt to communicate with one (two levels) further downstream. This is done by examining the routing table and identifying the intermediate electronic serial number that would have been used by the meter that wasn't responding, and relaying the signal directly to this intermediate electronic serial number.

If all else fails (on either upstream or downstream paths), a meter 9 may request help, using a packet referred to herein as a HELP_TRANSPORT packet, from any meter that can provide an alternate path to the destination meter or controller. Responses to this HELP_TRANSPORT packet are examined and a choice is made as to which of these to use as the next intermediate meter. The packet will be forwarded to this meter, by updating the intermediate meter electronic serial number to match that in the selected response and that meter will take over the responsibility of getting the packet to the next intermediate or final destination meter. The sending meter may optionally update its routing table to include as a child the new intermediate meter in the path to the destination meter to which it was originally trying to send.

The data section of the packets should be encrypted, but the data section control word should not be encrypted. The data section control word must be immediately recognisable to allow alarm traffic to take precedence over other types of information, and to allow the time data to be updated as it is being transferred from meter to meter.

Some mains communication networks may not have a controller 3, perhaps due to being of such a small size that a controller can not be justified. In FIG. 1, a diagrammatic representation of such a network is referenced 1A. The mains communication network 1 may be used to relay data to the mains communication network 1A. One or more specific meters 9, for example the meter 9 at customer site 8*i* acts as a relay to the mains communication network 1A, in particular to one or more meters 9B that can communicate with the meter at site 8*i*. The link between networks may be provided via a radio or dial-up telephone connection, in which case the meters designated as the link between networks are provided with the appropriate radio or telephone modem 11. The routing tables of the link meters and of the meters in the subsidiary network are manually configured using the network configuration packets described herein above YOU_HEARD_THESE (YHT) and YOUR_PARENT_IS (YPI).

To increase communication reliability, the packets are broken up into small pieces and reassembled by the destination meter or by the controller modem. The size of the packets is an important design variable for any mains communication network and size selection typically represents a trade-off between reliability and efficiency of communication.

To determine the maximum permissible packet size, an experimental method may be used. Over a period of time sufficiently long to represent a normal range of conditions over the network, which may be as long as several months and at various times of the day and under a variety of weather conditions, the mains communication network is sounded using meters equipped with bit error rate software. One meter continuously transmits while the other meters operate in receive mode. A known pattern is sent and time-stamped errors are stored by the receivers. These error files are then analysed to determine that the noise on the channel is bursty in nature and this may be used to determine the optimum packet size.

Differing length packets are used to convey information, with very short packets reserved for high priority messaging and longer packets up to the maximum length used for low priority messaging. For example alarm messages and load shed control signals (see herein below) may take the highest and second highest priority and have the lowest packet length.

Upgrading of Software

A potential disadvantage of intelligent meters is the difficulty of upgrading software to enhance functionality. Typically in prior art systems this can only be achieved by physically visiting each site, temporarily taking the meter out of service and downloading new software into the meter. The meters 9 of the present invention are provided with a computer processor 900 capable of In-Application-Programming (IAP) to enable remote software updates. The STMicroelectronics uPSD3234A microcontroller, available from STMicroelectronics of Geneva, Switzerland, supports IAP and includes dual banks of flash memory and a control register to allow its 8032 controller to run from one flash bank while erasing and updating the other bank. More than one version of the meter software can be stored in each meter 9, so that it is possible to drop back to an earlier version of the software if problems arise. The capability of remote software updates also permits the change of modem carrier frequencies and baud rate to enhance message transfer.

Network Loss Measurement

As a consequence of deregulation in the power supply industry, reconciliation of power supplied, power used and network losses has become a significant problem. The problem arises principally on the low voltage sub-network, where more than one retailer exists as well as a separate lines company. An additional meter, a low voltage master meter 12 may be provided to solve this problem. Specifically, the low voltage master meter 12 is a device placed between the distribution transformer 4 and the controller 3 that measures the total power supplied from the transformer 4 over all three phases. This power supply figure may be metered, for example, on a half-hourly basis and accumulated results forwarded to the controller 3 on a periodic basis. When all use data from the meters 9 and the power supply figure from the low voltage master meter 12 has been returned to the central control unit 2A, the database 2C can be used to determine line loss as the difference between power supplied and power used.

In addition, the efficiency of the transformer 4 may be measured. The low voltage master meter 12 and a high voltage meter 13 with pulse output remotely monitor distribution transformer efficiency. Specifically, the high voltage meter 13 is placed on the primary of the distribution transformer 4. It reads input 3-phase power on a half-hourly basis. The low voltage master meter 12 records total power output from the transformer on a half-hourly basis. At fixed intervals the controller 3 requests the half-hourly readings from both the high voltage meter 13 and the low voltage master meter 12 and stores these readings for subsequent forwarding to the central control unit 2A and database 2C. The database 2C is then able to use these readings to determine transformer efficiency.

Private-Side Applications of Mains Communication Network

The mains communication network described herein provides increased flexibility in the control of the power network and in the provision of additional services to customers. Examples of new applications for customers are provided below.

The mains communication network 1 may monitor the status of various devices and machines. This is achieved by connecting a serial interface 904 of a meter 9 to the device or machine. For domestic premises, an intelligent PLC relay can be used to automate a device or monitor an essential device such as a dialysis machine in the home. For hospital or rest-home applications, an intelligent PLC relay can be used to remotely monitor (for example from a nurse's station) the status of an essential piece of mains-powered equipment at a patient's bedside.

For residential "community" developments, the meters 9 may be used to automate the front gate and other limited or restricted access points such as a pool complex and for control of external lighting without the need for individual wiring to each dwelling. In one embodiment, a body-corporate residential development may have "always-on" web access in which all key control points (e.g. front gate and pool gates) have a web-cam in communication with a phase 7a-c, which links back to the residential development's central office, which is also on a phase 7a-c. Residents could then access the central office through the web to view the web-cam picture and grant or decline access. The caretaker or manager of the complex would have the ability to over-ride access or time-of-day controlled features by accessing the central office via the web. An advantage of this system is that individual wiring to each premises is not required.

The meters 9A in FIG. 1 may be dual meters. The meters 9A facilitate the monitoring and control of energy storage devices and of embedded generators so that their energy is made available to the grid at appropriate times. This control, when used in combination with power usage profiling, allows improved management of the energy supply within the entire mains communication network 100. A benefit of this may be a reduction in the need for spinning reserve. Specifically, the current power usage profile can be used (in combination with "historical" records) to determine when embedded generators should be turned on. Such generators could be switched on either by their owners or remotely by the utility by instructing the central control unit 2A to send an appropriate packet.

Furthermore, improved network management may be achieved using load shedding. The meters 9, together with an appropriate distribution board 15 (see FIG. 1) connected to the serial interface 904, permit remote load shedding. Specifically, a customer may offer up appliances for remote load shedding. The utility monitors customer power usage over a short period, say 2 months. On the basis of the power usage profile so determined, the utility offers the customer a special billing rate in return for permitting the utility to remotely shed load at the customer's premises. In addition, the customer can view their usage profile, via the web, and use this information to alter their usage pattern if appropriate. Load shedding is achieved by the central control unit 2A sending a LOAD SHED PACKET to a meter 9, the LOAD SHED PACKET designating the device that should be disconnected by a distribution board 15. The meter 9 then instructs the distribution board 15 to make the appropriate switching.

In one embodiment of the invention, power usage profiling may be used to indicate illness, for example by a significant increase or decrease in power usage or lack of change in power usage over an extended period. Specific customer sites 8a-8i may request a follow up call or visit should their power usage change (or not change) significantly to check that they are not immobilised or seriously unwell. Specifically, consumers with serious medical problems, who wish to remain living alone, can identify themselves to the utility and request monitoring of their power usage profile on a near real-time basis. Should their power usage profile depart significantly from the norm, notification of a potential problem is raised by the central control unit 2A to an administrator.

Using the infrastructure of the present invention, customers may be provided the option to have a dual-tariff agreement. At present, two meters are required to log power usage for customers on a dual tariff agreement. One meter is used for one particular tariff period and switched off at the time when the second tariff applies. Usage during the second tariff period is recorded on the second meter. Within the tariff periods no information is normally available on time-of-use, with the meter simply recording total usage. By using a meter 9 with the infrastructure of the present invention, including the database 2C, there is no need for a second meter. Reconciliation with the dual tariff structure can be achieved using records stored in the database 2C.

In some cases, customers may prepay their power account. Previously, if the account became in deficit or became in deficit for a certain period and/or by a certain amount, the supply of power would be discontinued. When the database 2C detects an account in deficit beyond some defined "grace period", the load shedding functionality is used to disconnect the bulk of the supply to the premises. The system could provide such customers only with an emergency supply, for example supply sufficient for lighting and a small amount of heating.

Text messages may be distributed via power line carrier. Specifically, via their meter 9 or customer display unit 10, a customer can arrange to receive text messages from and send text messages to, for example the meters 9 of other individuals, a structure (e.g. a body corporate), or to a wide area network 16 via the central control unit 2A. Advertising for a local community may be provided using the text message functionality. Specifically, individual consumers with a meter 9 can authorise their utility to add their electronic serial number to an address list for local advertisers or community groups. Local businesses and community groups can then arrange to have advertising messages or community notices forwarded to these consumers via the central control unit 2A.

For applications where an alarm is generated, in addition to the usual alarm notification procedures, a text message may be sent to the neighbouring properties should an alarm be triggered. Should an intruder be on the premises, it is likely a neighbour could notify the Police in advance of the arrival of a security guard. Also, nominated contacts (such as nearest neighbours) may be sent a text message when a medical alarm is tripped or when the "at risk" power usage profile threshold is crossed. Such notification would be additional to any telephone contact specified in the event of an alarm. The telephone contact may be initiated directly by the meter 9 through a telephone modem connected to its serial interface 904 or alternatively by the central control unit 2A in respect to the alarm notification.

Where in the foregoing description reference has been made to specific components or integers having known equivalents, then those equivalents are hereby incorporated herein as if individually set forth.

Although the foregoing description of the invention has been given by way of example with reference to the accompanying drawings, those skilled in the relevant arts will appreciated that modifications or improvements may be made thereto without departing from the scope of the invention as defined in the appended claims.

The claims defining the invention are as follows:

1. An intelligent device for a power line communication system, comprising:
   a memory storing information uniquely specifying the identity of the intelligent device and an interface for data communication with a power line; and
   a configuration processing arrangement to perform a configuration process, which includes using said interface to perform the following:
   a) detecting data of a first data type through the interface and in response thereto extracting from the data of a first data type and recording in memory identity information for the source of the data of a first data type and generating on said interface data of a second data type that has as a destination address the source of the data of a first data type and includes the information specifying the identity of the intelligent device;
   b) detecting data of a second data type that have the intelligent device as a destination address and in response thereto extracting from the data of a second data type and recording in memory the identity of the source of the data of a second data type and generating on said interface data of a third data type that includes information identifying the source of the data of a second data type and the information specifying the identity of the intelligent device; and
   c) detecting data of a third data type and in response extract there from and recording in memory information identifying the source of the data of a third data type associated with the information identifying the source of the data of a second data type included in the data of a third data type and generating data on said interface containing the information identifying the source of the data of a third data type, the information identifying the source of the data of a second data type included in the data of a third data type and the information specifying the intelligent device's identity.

2. The intelligent device of claim 1, wherein the data generated according to c) is addressed to at least one source of data detected according to a).

3. The intelligent device of claim 2, wherein the of extracting and recording according to c) are only performed for data of a third data type that are addressed to the intelligent device.

4. The intelligent device of claim 1, wherein the address of the intelligent device is the same as the information specifying the intelligent device's identity.

5. The intelligent device of claim 1, wherein an indicator of the quality of communication between itself and the source of detected data and rank identity information recorded in memory dependent on said indicator is determined.

6. The intelligent device of claim 1, wherein, in response to detection of data of a second data type, data of a fourth data type is generated including as a destination address the source of the data of a second data type and the configuration process may further include using said interface to detect data of a fourth data type that have the device as a destination address and in response thereto generate on said interface data of a first data type.

7. The intelligent device of claim 1, wherein detected data of a second data type that were generated by a source that was recorded in memory as a source of data of a first data type according to a) is ignored.

8. The intelligent device of claim 1, wherein:
   said interface is used to generate data of a first data type,
   the data of a first data type include a counter, and
   the process a) further includes identifying the value of the counter of any data of a first data type detected, associating the value of the counter with the recorded identity information for the source of the data of a first data type, incrementing the value of the counter and allocating the incremented value to a counter in any data of the first data type generated by the intelligent device as a result of data received from the source of the data of a first data type.

9. The intelligent device of claim 8, wherein detected data of a first data type that has a counter value more than a threshold value is ignored.

10. The intelligent device of claim 9, wherein the threshold value is a value related to the value of the counter from the last data of a first data type received.

11. The intelligent device of claim 10, wherein the threshold value is one more than the value of the counter from the last data of a first data type received.

12. The intelligent device of claim 1, wherein the data of a third data type include a counter and the data generated according to c) is in the form of data of a third data type and the intelligent device associates the value of the counter with the information recorded according to c) that identifies the source of the data of a third data type and the intelligent device increments the counter when generating data of a third data type in response to detection of data of a third data type according to c).

13. The intelligent device of claim 1, wherein data is generated onto said interface otherwise than in accordance with the configuration process.

14. The intelligent device of claim 1, wherein text messages are generated onto said interface.

15. The intelligent device of claim 1, wherein control messages are received through said interface and communicate control messages to a power distribution board to facilitate load shed dependent on said control messages.

16. A power line communication system comprising:
   a plurality of power lines in communication with a controller through a power line modem, each power line having a plurality of intelligent devices in communication with it, wherein each of the plurality of intelligent devices includes:
   a memory storing information uniquely specifying the identity of the intelligent device and an interface for data communication with a power line; and
   a configuration processing arrangement to perform a configuration process, which includes using said interface to perform the following:
   a) detecting data of a first data type through the interface and in response thereto extracting from the data of a first data type and recording in memory identity information for the source of the data of a first data type and generating on said interface data of a second data type that has as a destination address the source of the data of a first data type and includes the information specifying the identity of the intelligent device;

b) detecting data of a second data type that have the intelligent device as a destination address and in response thereto extracting from the data of a second data type and recording in memory the identity of the source of the data of a second data type and generating on said interface data of a third data type that includes information identifying the source of the data of a second data type and the information specifying the identity of the intelligent device; and c) detecting data of a third data type and in response extract there from and recording in memory information identifying the source of the data of a third data type associated with the information identifying the source of the data of a second data type included in the data of a third data type and generating data on said interface containing the information identifying the source of the data of a third data type, the information identifying the source of the data of a second data type included in the data of a third data type and the information specifying the intelligent device's identity;

wherein the controller is configured as one of said plurality of intelligent devices and is also in communication with a computer controller that is configured to receive data from the intelligent devices via the controller and to send data to the intelligent devices via the controller.

17. The power line communication system of claim 16, wherein:

data other than configuration data, which is generated onto a power line by an intelligent device or the controller, includes a destination address and an intermediate address, and each intelligent device monitors communications on the power line and if the destination address of communications matches information identifying the source of the data of a second data type included in the data of a third data type that was recorded by an intelligent device in accordance with c), then that intelligent device regenerates the data, but with the intermediate address field comprising the information identifying the source of the data of a third data type recorded according to c) that is associated with the information identifying the source of the data of a second data type included in the data of a third data type that matches the destination address.

* * * * *